(12) United States Patent
Peting et al.

(10) Patent No.: US 12,301,182 B2
(45) Date of Patent: May 13, 2025

(54) CLASS-D AMPLIFIER FOR REDUCING AUDIO DISTORTION

(71) Applicant: SKYWORKS SOLUTIONS, INC., Irvine, CA (US)

(72) Inventors: Mark R. Peting, Yamhill, OR (US); Eric Thomas King, San Jose, CA (US); Taehwan Oh, Portland, OR (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 413 days.

(21) Appl. No.: 17/935,629

(22) Filed: Sep. 27, 2022

(65) Prior Publication Data

US 2023/0102992 A1 Mar. 30, 2023

Related U.S. Application Data

(60) Provisional application No. 63/250,743, filed on Sep. 30, 2021, provisional application No. 63/250,758, filed on Sep. 30, 2021.

(51) Int. Cl.
*H03F 3/217* (2006.01)
*H03F 1/52* (2006.01)

(52) U.S. Cl.
CPC ........... *H03F 3/2171* (2013.01); *H03F 1/523* (2013.01); *H03F 3/2173* (2013.01); *H03F 3/2175* (2013.01); *H03F 2200/03* (2013.01); *H03F 2200/351* (2013.01)

(58) Field of Classification Search
CPC ...... H03F 3/2171; H03F 1/523; H03F 3/2173; H03F 3/2175; H03F 2200/03; H03F 2200/351; H03F 1/3264; H03F 3/187
USPC ........................................ 330/10, 207 A, 251
See application file for complete search history.

(56) References Cited

U.S. PATENT DOCUMENTS

| | | | |
|---|---|---|---|
| 7,443,200 B2 | 10/2008 | Quinn et al. | |
| 8,207,788 B2 | 6/2012 | Lee et al. | |
| 11,290,069 B2 * | 3/2022 | He | H03F 3/2171 |
| 2018/0337636 A1 | 11/2018 | Martinez et al. | |
| 2018/0337645 A1 | 11/2018 | Link et al. | |
| 2019/0214950 A1 | 7/2019 | Quinn | |
| 2020/0228076 A1 | 7/2020 | Lee | |
| 2021/0012763 A1 | 1/2021 | Wurtz | |

* cited by examiner

*Primary Examiner* — Hieu P Nguyen
(74) *Attorney, Agent, or Firm* — Lando & Anastasi, LLP

(57) ABSTRACT

A class-D amplifier having an output driver with a first, second, and third driver, the output driver having a first output coupled to the first and third drivers, a second output coupled to the second driver; a sensing resistor coupled in series between the first driver and the first output; and a pulse width modulation (PWM) controller coupled to the inputs of the drivers and configured to receive an audio input signal; control a PWM generator to generate a first pulse signal and a second pulse signal based on the audio input signal and a power supply input; determine a voltage drop across the sensing resistor; and, responsive to the voltage drop being greater than a threshold, sequence control of the first pulse signal to the first driver and switch a voltage at the first driver to an increased voltage based on the voltage drop.

20 Claims, 5 Drawing Sheets

CLASS-D AMPLIFIER FOR REDUCING AUDIO DISTORTION

CROSS-REFERENCE TO RELATED APPLICATIONS

This application claims priority under 35 U.S.C. § 119(e) to U.S. Provisional Patent Application Ser. No. 63/250,743, titled "A CLASS-D AMPLIFIER FOR REDUCING AUDIO DISTORTION," filed Sep. 30, 2021, and to U.S. Provisional Patent Application Ser. No. 63/250,758, titled "A SWITCHING AUDIO AMPLIFIER WITH IMPROVED VOLTAGE SUPPLY CONTROL," filed Sep. 30, 2021, each of which are incorporated by reference in their entirety for all purposes.

BACKGROUND

Field

Aspects and embodiments of the present disclosure relate to a Class-D amplifier, and in particular a Class-D amplifier for reducing audio distortion. Aspects and embodiments of the present disclosure also relate to a method for reducing audio distortion in a Class-D amplifier.

Description of the Related Technology

In many audio applications, to produce sound, an audio signal is amplified by an amplifier, and the amplified audio signal is provided to a speaker. When implemented in an electronic device such as an audio device having a limited power source such as a battery, the operating mode of such an amplifier may be changed, and each operating mode may provide advantages and disadvantages.

Class D (or switching) amplifiers work by generating pulses using a modulator, the pulses having fixed amplitude but varying width and separation, or by varying the number of pulses per unit time, representing the amplitude variations of an analog audio input signal. Conventionally, the modulator compares analog voltages against a particular waveform, usually a triangular waveform, to decide how wide a pulse should be. The output of the modulator is then used to control the gates of output transistors to alternate turning the output transistors on and off, thus creating a signal for the speakers. A low-pass filter may be used to provide a path for the low-frequencies of the audio signal, leaving the high-frequency pulses behind, to output to speakers, for example, of a pair of headphones.

SUMMARY

According to an embodiment, there is provided a Class-D amplifier comprising: an output driver having: a first driver, a second driver, and a third driver, each having an input and an output, and the output driver having a first output coupled to the outputs of the first driver and the third driver, and a second output coupled to the output of the second driver; a sensing resistor coupled in series between the output of the first driver and the first output; and a pulse width modulation (PWM) controller coupled to the inputs of the first, second, and third drivers and being configured to: receive an audio input signal; control a PWM generator to generate a first pulse signal to drive a current at the first driver and a second pulse signal to drive a current at the second driver based on the audio input signal and a power supply input; determine a voltage drop across the sensing resistor; and, if the voltage drop is greater than a predetermined threshold, sequence control of the first pulse signal to the first driver and switch a voltage at the first driver from the power supply input to an increased voltage supply based on the voltage drop.

In some examples, the PWM controller may be configured to determine the voltage drop across the sensing resistor by determining the voltage at the third driver relative to the first driver.

In some examples, the voltage at the first driver may be configured to be increased by at least as much as the magnitude of the voltage drop across the sensing resistor.

In some examples, the PWM controller may be configured to sequence control of the first pulse signal by temporarily stopping the first pulse signal while the voltage at the first driver is switched to the increased voltage supply, and continuing to provide the second pulse signal.

In some examples, the PWM controller may be further configured to further switch the voltage at the first driver from the increased voltage supply to a third voltage supply providing a higher voltage than the increased voltage supply.

In some examples, the first output and second output of the output driver may be coupled to a loudspeaker, the output driver being configured to provide an output current signal corresponding to the audio input signal to drive the loudspeaker.

In some examples, the sensing resistor may have a resistance approximately equal to a load impedance of the loudspeaker.

In some examples, the Class-D amplifier may be configured to operate in a high output resistance (HOR) mode in which the third driver does not drive a current.

In some examples, the Class-D amplifier may be configured to operate in an intermediate mode between a high output resistance (HOR) mode and a zero output resistance (ZOR) mode, the PWM controller being configured to provide a third pulse signal to drive a voltage at the third driver in the intermediate mode based on the audio input signal and a power supply input; and the PWM controller may be configured to determine the voltage drop across the sensing resistor by determining the voltage at the third driver relative to the first driver, the voltage at the third driver at least in part being determined using a sensing network coupled to the output of the third driver.

In some examples, the output driver may further comprise: a fourth driver having an input and an output; and a second sensing resistor coupled in series between the output of the fourth driver and the second output of the output driver, wherein the PWM controller may be further configured to: provide a fourth pulse signal to drive a current at the fourth driver based on the audio input signal and the power supply input; determine a voltage drop across the second sensing resistor; and, if the voltage drop across the second sensing resistor is greater than a predetermined threshold, sequence control of the fourth pulse signal to the fourth driver and switch a voltage at the fourth driver from the power supply input to an increased voltage supply based on the voltage drop across the second sensing resistor.

In some examples, the PWM controller may be configured to switch the voltage at the first driver to the increased voltage supply over a switching interval, and the PWM controller may be further configured to control a cover pulse driver having an output coupled to the first output of the output driver via the sensing resistor to drive a current across the sensing resistor to the first output during the switching interval.

In some examples, the PWM controller may be configured to, before the switching interval, turn on a transistor at the cover pulse driver to couple the first output with a voltage supply rail via the sensing resistor for driving the current across the sensing resistor during the switching interval, and after the switching interval, turn off the transistor.

In some examples, the output driver may be a H-Bridge amplifier.

In some examples, the current at the first driver may have positive polarity and the current at the second driver may have a negative polarity. In some examples, the current at the first driver may have negative polarity and the current at the second driver may have a positive polarity.

In some examples, the third driver may comprise one or more protection diodes.

According to an embodiment, there is provided a packaged module comprising: a packaging substrate configured to receive a plurality of components; and a chip scale package mounted on the packaging substrate, the chip scale package having a silicon die that includes: an output driver having: a first driver, a second driver, and a third driver, each having an input and an output, and the output driver having a first output coupled to the outputs of the first driver and the third driver, and a second output coupled to the output of the second driver; a sensing resistor coupled in series between the output of the first driver and the first output; and a pulse width modulation (PWM) controller coupled to the inputs of the first, second, and third drivers and being configured to: receive an audio input signal; control a PWM generator to generate a first pulse signal to drive a current at the first driver and a second pulse signal to drive a current at the second driver based on the audio input signal and a power supply input; determine a voltage drop across the sensing resistor; and, if the voltage drop is greater than a predetermined threshold, sequence control of the first pulse signal to the first driver and switch a voltage at the first driver from the power supply input to an increased voltage supply based on the voltage drop.

According to an embodiment, there is provided an electronic device comprising: an output driver having: a first driver, a second driver, and a third driver, each having an input and an output, and the output driver having a first output coupled to the outputs of the first driver and the third driver, and a second output coupled to the output of the second driver; a sensing resistor coupled in series between the output of the first driver and the first output; and a pulse width modulation (PWM) controller coupled to the inputs of the first, second, and third drivers and being configured to: receive an audio input signal; control a PWM generator to generate a first pulse signal to drive a current at the first driver and a second pulse signal to drive a current at the second driver based on the audio input signal and a power supply input; determine a voltage drop across the sensing resistor; and, if the voltage drop is greater than a predetermined threshold, sequence control of the first pulse signal to the first driver and switch a voltage at the first driver from the power supply input to an increased voltage supply based on the voltage drop, the first output and second output of the output driver being coupled to a loudspeaker to provide an output current signal corresponding to the audio input signal to drive the loudspeaker.

According to an embodiment, there is provided a method for reducing audio distortion in a Class-D amplifier, the method comprising: a pulse width modulation (PWM) controller of a Class-D amplifier: receiving an audio input signal; controlling a PWM generator to generate a first pulse signal to drive a current at a first driver of an output driver and a second pulse signal to drive a current at a second driver of the output driver based on the audio input signal and a power supply input, the output driver also having: a third driver; a first output coupled to outputs of the first driver and the third driver; and a second output coupled to an output of the second driver; determining a voltage drop across a sensing resistor coupled between the output of the first driver and the first output of the output driver; and if the voltage drop is greater than a predetermined threshold, sequencing control of the first pulse signal to the first driver and switching a voltage at the first driver from the power supply input to an increased voltage supply based on the voltage drop.

In some examples, the method may further comprise the PWM controller determining the voltage drop across the sensing resistor by determining the voltage at the third driver relative to the first driver.

In some examples, the voltage at the first driver may be increased by at least as much as the magnitude of the voltage drop across the sensing resistor.

In some examples, the sequencing control of the first pulse signal to the first driver may comprise temporarily stopping the first pulse signal while the voltage at the first driver is switched to the increased voltage supply, and continuing to provide the second pulse signal.

In some examples, the method may further comprise the PWM controller further switching the voltage at the first driver from the increased voltage supply to a third voltage supply providing a higher voltage than the increased voltage supply.

In some examples, the first and the second output of the output driver are coupled to a loudspeaker, the output driver providing an output current signal corresponding to the audio input signal to drive the loudspeaker.

In some examples, the sensing resistor has a resistance approximately equal to a load impedance of the loudspeaker.

In some examples, the method may further comprise the Class-D amplifier operating in a high output resistance (HOR) mode in which the third driver does not drive a current.

In some examples, the method may further comprise the Class-D amplifier operating in an intermediate mode between a high output resistance (HOR) mode and a zero output resistance (ZOR) mode; the PWM controller providing a third pulse signal to drive a current at the third driver in the intermediate mode based on the audio input signal and a power supply input; and the PWM controller determining the voltage drop across the sensing resistor by determining the voltage at the third driver relative to the first driver, the voltage at the third driver at least in part being determined using a sensing network coupled to the output of the third driver.

In some examples, the output driver may further comprise: a fourth driver having an output; and a second sensing resistor coupled in series between the output of the fourth driver and the second output of the output driver, wherein the method may further comprise the PWM controller: providing a fourth pulse signal to drive a current at the fourth driver based on the audio input signal and a power supply input; determining a voltage drop across the second sensing resistor; and, if the voltage drop across the second sensing resistor is greater than a predetermined threshold, sequencing control of the fourth pulse signal to the fourth driver and switching a voltage at the fourth driver from the power supply input to an increased voltage supply based on the voltage drop across the second sensing resistor.

In some examples, the method may further comprise the PWM controller: switching the voltage at the first driver to the increased voltage supply over a switching interval; and controlling a cover pulse driver having an output coupled to the first output of the output driver via the sensing resistor to drive a current across the sensing resistor to the first output during the switching interval.

In some examples, the method may further comprise, before the switching interval, turning on a transistor at the cover pulse driver to couple the first output with a voltage rail via the sensing resistor for driving the current across the sensing resistor during the switching interval, and after the switching interval, turning off the transistor.

In some examples, the output driver may be a H-Bridge amplifier.

In some examples, the current at the first driver may have positive polarity and the current at the second driver may have a negative polarity. In some examples, the current at the first driver may have negative polarity and the current at the second driver may have a positive polarity.

In some examples, the third driver may comprise one or more protection diodes.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Class-D amplifiers may include an output driver having multiple drivers. When switching a driver between voltage supplies or voltage supply rails, it is possible that another driver in the output driver can reach unsupported voltages, which may give rise to audio distortion ("noise"). Likewise, in some class-D amplifiers, output impedance may be relatively low and stray magnetic fields can arise from wiring within a device implementing the class-D amplifier. The stray magnetic fields can cause wires and other components to inductively couple, inducing voltages. Since the output impedance may be relatively low, the induced voltages may cause noise. In low power electronic devices, the induced voltages can cause undesirable amounts of noise.

Aspects and embodiments described herein are directed to a Class-D amplifier capable of reducing audio distortion, for example, at a loudspeaker. Embodiments disclosed herein provide an amplifier to convert digital audio data to a speaker signal, using a Class D or switching amplifier, which may be used in an electronic device such as headphones. The Class D amplifier may utilize low power to operate and provide an efficient driving signal for headphone speakers. In particular, the Class-D amplifier may operate in a plurality of modes explained in more detail below. In some modes, the class-D amplifier may be configured such that control of the output drive sequencing by a PWM controller, as well as adjustment of voltages at a driving pin, can prevent a driver from reaching unsupported voltages. Audible glitches, during a non-overlap period when switching between power supplies, can be prevented with the inclusion of an extra set of driver transistors, for example in the form of a cover pulse driver.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1:
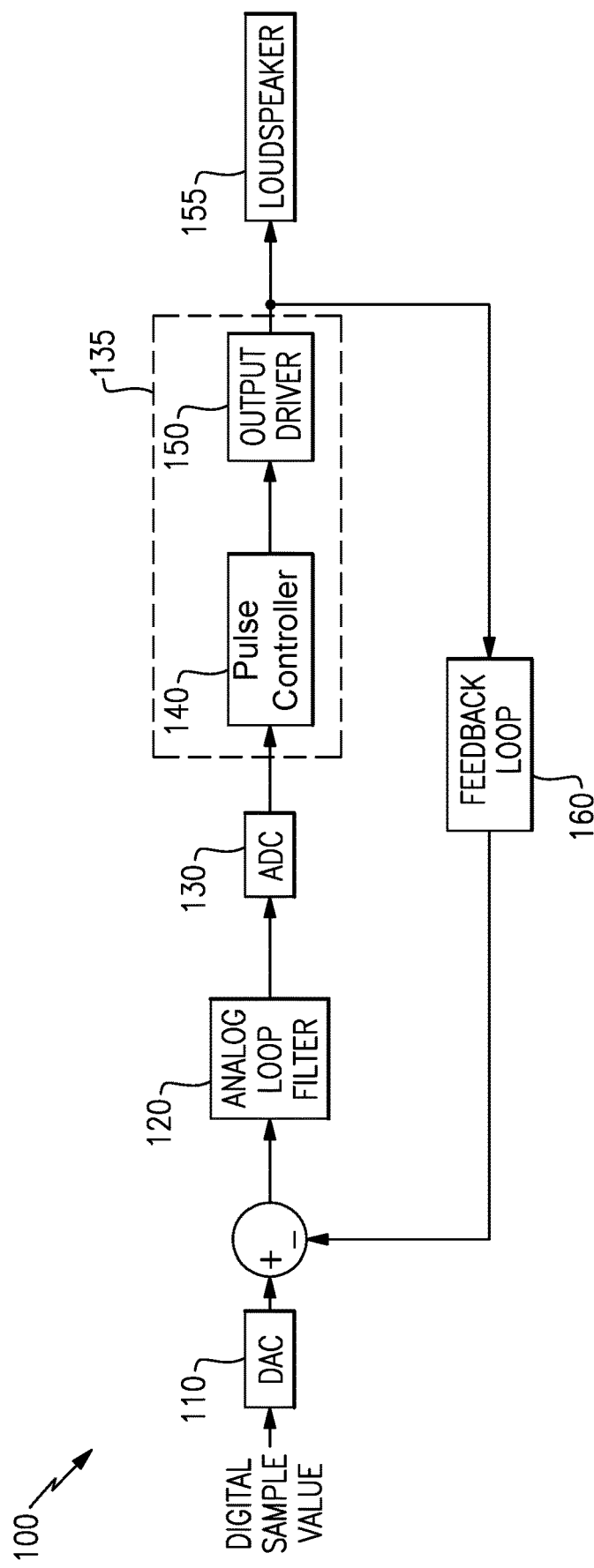
FIG. 1 is a block diagram of a Class-D amplifier according to aspects of the present disclosure.

FIG. 1 illustrates an example Class D amplifier 100 according to aspects of the present disclosure. Broadly, the Class D amplifier 100 integrates the error between a desired audio level as set by the input audio signal and the actual output voltage across a loudspeaker (often referred to herein as a "speaker"). The error is digitized and sent to a pulse width modulation (PWM) controller to generate a differential pulse on one of a set of possible supply voltages. The PWM controller may be part of the amplifier block 135, as discussed with respect to FIG. 2. The PWM controller is responsible for controlling the pulse controller 140 to optimally generate a pulse given an analog-to-digital converter (ADC) sampled value and available supply voltages.

In more detail, the amplifier 100 comprises a digital-to-analog converter (DAC) 110 configured to output a current based on a digital audio input signal, an output electrically connected to a loudspeaker 155 and configured to output an output signal to the loudspeaker 155, and a pulse width modulation (PWM) loop configured to receive an error signal. The PWM loop may be considered the feedback loop 160 as well as the analog loop filter 120, ADC 130, and amplifier block 135. The PWM loop is discussed in greater detail below. The error signal is based on a difference between the current from the current DAC 110 and a current of the output signal. The PWM loop is configured to generate the output signal based on the error signal. The PWM loop processes the audio signal data in digital form using an analog-to-digital converter (ADC) 130 configured to receive an analog signal based on the current from the current DAC 110 and to output a digital signal representing the analog signal using an encoder configured to receive the digital signal and output a pulse having a width based on the analog signal. The amplifier can receive a digital signal related to media content and convert the digital signal to an analog signal to output to headphone speakers.

As illustrated in FIG. 1, the amplifier 100 receives digital data at a digital data input, as well as a clock signal received at a clock input (clock signal and clock input not shown). The DAC 110 outputs a current that is sent to a pulse width modulation (PWM) loop where the current is summed with the output current of the feedback loop 160 to produce a summed current. In some examples, the summed current is created by subtracting the feedback loop 160 current from the DAC 110 current. The summed current is provided to an analog loop filter 120 that filters the summed current before providing the summed current to the analog-to-digital converter (ADC) 130. The ADC 130 may be a successive approximation register (SAR) ADC. The ADC 130 converts the summed current from analog to digital form and provides a digital signal to the pulse controller 140 of the amplifier block 135. Operation of the amplifier block 135 is controlled by a pulse controller 140 that includes a PWM controller (discussed infra, for example, in FIG. 2). The PWM controller controls the pulse controller 140 to provide a pulsed signal based on the digital signal to the output driver 150. In some examples, the PWM controller may be configured to directly receive the digital signal. The output driver 150 provides a drive signal that corresponds to the pulsed signal to the loudspeaker 155 and to the feedback loop 160. The pulsed signal received by the output driver 150 from the pulse controller 140 may have a specific voltage. The output driver 150 may select an appropriate voltage for the drive signal based on the height (i.e., amplitude) of the pulsed signal at any given point. The output driver 150 may select the appropriate voltage, and transistors connected to the selected voltage can be switched on and off based on pulse widths of the pulsed signal. The drive signal may then be provided as an output signal to the speakers through positive and negative contacts.

Embodiments of the present disclosure relate particularly to the PWM control, and its control of the pulse controller 140 and operation of the output driver 150. The amplifier block 135 will be a term used herein to collectively describe the PWM controller, the pulse controller 140, and the output driver 150.

The PWM loop of the amplifier 100 includes a feedback loop 160 that is configured to guide a portion of the drive signal, for example, the feedback loop 160 current, from the output driver 150 back into the analog loop filter 120, for example by using sense resistors. This feedback drive signal may then be used to provide negative feedback error correction in the amplifier 100 by using a subtractor summing circuit to provide a signal corresponding to the difference between the drive signal and the analog audio signal output by the DAC 110, and to input the summed signal into the analog loop filter 120. In this manner, the analog loop filter 120 is responsible for keeping the amplifier 100 stable and locking the output of the output driver 150 to the input from DAC 110.

The analog loop filter 120 may be configured to provide a high loop gain over the band of audio frequencies to amplify the error between the drive signal and the output of the DAC 110. The error amplification may be implemented using a fifth order loop filter, which may be configured to amplify the error by approximately thirty thousand or more. However, it will be appreciated that embodiments of the disclosure are not limited to such fifth order loop filters. The high gain from the loop filter 120 can ensure that the output and the desired signal are very closely matched by amplifying the error. Rather than using conventional techniques of processing data in analog form, the PWM loop may be implemented to process the data in digital form using the ADC 130. The ADC 130 may receive an analog signal based on the signal from the analog loop filter 120, and output a digital signal representing the analog signal. The amplifier block 135 may be configured to receive the digital signal from the ADC 130 and output a pulse, for example, a pulse of the drive signal, having a width based on the analog signal received by the ADC 130.

As noted previously, stray magnetic fields can arise from wiring within a device implementing the amplifier. These stray magnetic fields can couple to wiring and induce voltages, which can appear at the loudspeaker and show up as noise. This may be more problematic in low power electronic devices in which relatively high magnetic fields exist and may couple to the wiring.

The Class-D amplifier 100 according to aspects of the present disclosure can operate in various operational modes. For example, the Class-D amplifier 100 may operate in a high output resistance (HOR) mode, a zero output resistance (ZOR) mode, or an intermediate mode operating between the HOR and ZOR modes.

In the HOR mode, the amplifier 100 delivers a current rather than a voltage. Therefore, if voltage is induced in wiring due to stray magnetic fields as described, a voltage drop may appear across the amplifier 100 input, but the amplifier 100 can merely adjust the current to match, thus reducing or eliminating noise arising from stray magnetic fields. The Class-D amplifier 100 may operate in HOR mode where needed, or using a combination of HOR and ZOR modes. However, when operating in HOR mode (as will be explained in more detail below), the current is driven through a resistor in series to the load, meaning a portion of the drive signal goes to the resistor and another portion goes to the load (for instance, half of the drive signal may go to the resistor, and half may go to the load). Therefore, a portion of the drive signal's power may be lost (for example, half the power). It may therefore be advantageous to switch back to ZOR (or voltage) mode where possible.

Figure 2:
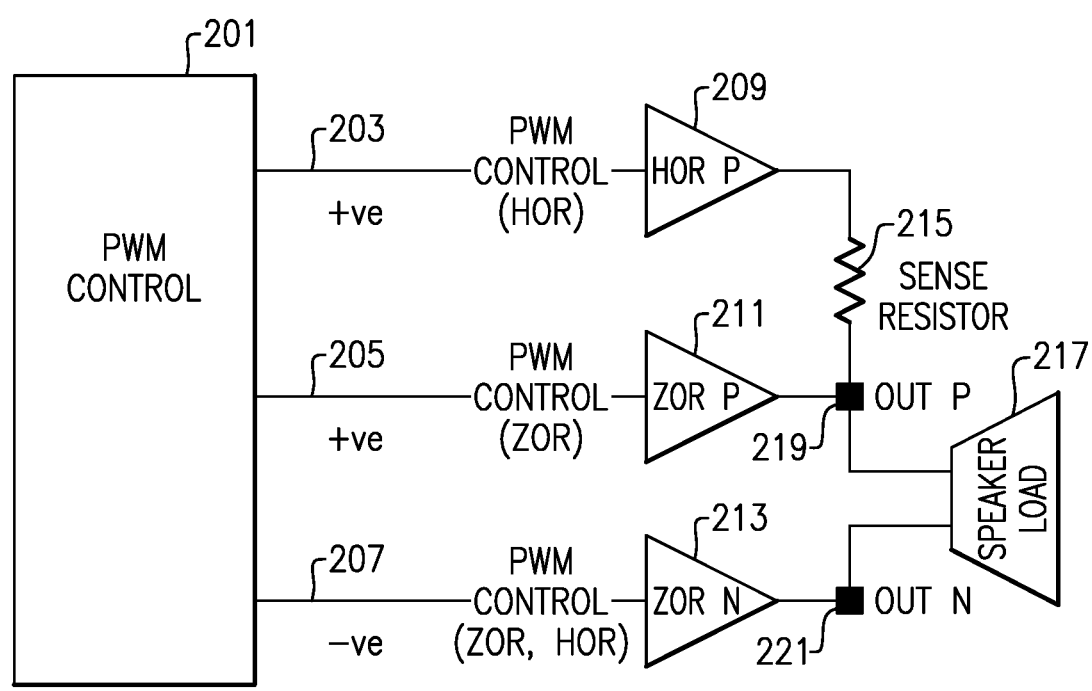
FIG. 2 is a block diagram of a portion of a Class-D amplifier including a pulse-width modulation (PWM) controller and output driver according to aspects of the present disclosure.

FIG. 2 illustrates an example of the amplifier block 135 of the amplifier 100. Referring to FIG. 2, a Class-D amplifier according to some embodiments of the present disclosure comprises a PWM controller in the PWM control block 201 and an output driver having a first, second, and third driver. In this example, the first, second, and third drivers are a HOR positive driver 209, a ZOR negative driver 213, and a ZOR positive driver 211 respectively. Drivers 209, 211, and 213 comprise inputs 203, 205, and 207 respectively, each coupled to the PWM control block 201, and each driver has an output. The output driver comprises a first (positive) output 219 and second (negative) output 221, which may be in the form of positive and negative pins that are coupled to the loudspeaker 217. A sensing resistor 215 is coupled in series between the output of the HOR positive driver 209 and the positive output pin 219 of the output driver. The output of the ZOR positive driver 211 is also coupled to the positive output pin 219, with the output of the ZOR negative driver 213 being coupled to the negative output pin 221 of the output driver.

When operating in ZOR mode or voltage mode, the output voltage is sensed directly. That is, the third driver or ZOR positive driver 211 is coupled to an input network including a pair of sensing resistors configured to sense a difference in output between the positive output pin 219 and the negative output pin 221. The voltage output from the ZOR positive driver 211 is provided back to an integrator driven by a combination of a limit amplifier and a current provided by an audio DAC. Negative feedback error correction is provided using a subtractor summing circuit to provide a signal corresponding to the difference between the drive signal and the analog audio signal output by the DAC and to input the difference into the analog loop filter. The loop filter provides gain for the error signal, for example approximately 100 dB gain, so any error in the output is multiplied and is looped back around to correct the error. The voltage sensed by the pair of resistors in the input network is adjusted to match whatever current is being delivered by the audio DAC. Furthermore, during ZOR mode, the HOR positive driver 209 is disabled and may be considered floating.

When operating in ZOR mode, there is no significant adverse effect when the drive circuitry is switched off. For example, when a pulse driving a voltage is provided by the PWM generator to the ZOR positive driver 211 and the output driver is subsequently switched off at the end of the pulse, current is circulating through the headphone inductance which can drive the output back against a protection diode (not shown) at the ZOR positive driver 211. The voltage may reach, for example, negative 0.5V (for the positive driver) against the diode before a ground drive is switched on the voltage returns to at or near ground. In ZOR mode, the system senses the reverse voltage that goes in the loop filter as part of the overall capture of the average voltage, and thus no distortion is caused with the high gain system.

However, when operating in HOR mode or current mode, output from the HOR positive driver 209 is driven across the sensing resistor 215. In HOR mode, the output driver can be considered to have three pins. Firstly, the output driver comprises a first driver which here is the HOR positive driver 209. The HOR positive driver 209 provides the input to a network comprising a sensing resistor 215, and functions as a standard digital driver which may either be open or driven to a voltage, for example a voltage of a voltage supply rail. The output driver also comprises a second driver which in this example is a ZOR negative driver 213. Whilst labelled a ZOR negative driver 213, this driver drives current having negative polarity in HOR mode, ZOR mode, and intermediate modes. Lastly, the output driver comprises a ZOR positive driver 211. In ZOR mode (voltage mode) or an intermediate mode, the ZOR positive driver 211 drives a voltage. However, in HOR mode, the ZOR positive driver 211 does not drive a voltage. The ZOR positive driver 211 comprises one or more diodes such as protection diodes (not shown).

In HOR mode or an intermediate mode, audio distortion is reduced or prevented. The output driver drives the PWM pulses with an internal series sensing resistor 215 ahead of the positive output pin 219. The sensing resistor 215 is in series between the outputs of the HOR positive driver 209 and the positive output pin 219. When driving positive current, if the positive side of the output driver switches to another power supply (for example, to a ground supply), circulating current in the speaker can drive the positive output pin 219 below the reference voltage. For example, the positive output pin 219 may be driven more than a volt below the reference voltage, which results in noise. Said differently, when current is circulating in the speaker, voltage at the ZOR positive driver 211 and the positive output pin 219 can be pulled down to unsupportable voltages when the power supply driving the HOR positive driver 209 is switched from a positive voltage to a different voltage, such as the reference voltage. When the switching occurs, the circulating current is driven back against protection diodes at the ZOR positive driver 211, which will cause the protection diodes to turn on and clip. The circulating current is not accounted for, and instead of flowing to the speaker load 217 through the positive pin 219, it flows to ground. Any current unaccounted for and not flowing to the speaker load 217 shows up as undesirable noise at the loudspeaker, for example, loudspeaker 155.

To advantageously reduce or prevent noise due to the circulating current during HOR or intermediate operating modes, the pulse width modulation and driving of the output driver are controlled. The PWM control block 201 includes a PWM controller and a PWM generator. As explained above, the PWM controller receives an audio input signal (that may have been passed through a DAC, an analog loop filter, and an ADC). The PWM controller is configured to control the PWM generator to generate a first pulse signal to drive a current at the first driver (the HOR positive driver 209) and a second pulse signal to drive a current at the second driver (the ZOR negative driver 213) based on the audio input signal and a power supply input. That is, the PWM controller is configured to control the PWM generator to provide pulse width modulation signals to the first and second drivers. The power supply input is determined by a power supply coupled to the amplifier. That is, the amplifier may be coupled to one of a plurality of power supplies or supply rails or voltage rails, a battery voltage, or a ground supply rail. The power supplies, supply rails, voltage rails, or battery may provide any desired voltage.

In this example, the current at the HOR positive driver 209 has a positive polarity and the current at the ZOR negative driver 213 has a negative polarity. However, it will be appreciated that embodiments of the present disclosure could similarly be applied to an arrangement in which the HOR positive driver 209 drives a negative current, the ZOR negative driver 213 drives a positive current, and the sense resistor is coupled between the output of the negative polarity HOR positive driver 209 and the negative output pin 221. Those skilled in the art will appreciate that the relevant polarities merely need be reversed compared to the presently described example.

The PWM controller of the PWM control block 201 is configured to determine a voltage drop across the sensing resistor 215. That is, the PWM controller determines a voltage at the ZOR positive driver 211 relative to a voltage at the HOR positive driver 209. The PWM controller receives the audio signal input being played, which is converted to a current. The PWM controller is then able to determine the voltage at the ZOR positive driver 211 relative to the HOR positive driver 209 as both the current and the load resistance is known, thus voltage can be calculated using $V=IR$. When driving a positive voltage across the sensing resistor 215, the voltage drop across the sensing resistor 215 will be negative relative to the driving pin (the HOR positive driver 209). The PWM controller may be configured to determine the voltage drop across the sensing resistor 215 when the power supply driving the HOR positive driver 209 is switched.

When driving a positive voltage at the HOR positive driver 209, the PWM controller of the PWM control block 201 determines the voltage drop across the sensing resistor 215 and, if the voltage drop is greater than a predetermined threshold, the PWM controller sequences control of the first pulse signal to the input of the first driver (here the HOR positive driver 209), and also switches a voltage at the HOR positive driver 209 from the power supply input to an increased voltage supply based on the voltage drop. In more detail, the PWM controller may determine whether the voltage drop is enough such that, when the HOR positive driver 209 is switched from a positive driving voltage to ground, the voltage at the positive output pin 219 will drop below ground and therefore reach an unsupported voltage (or in some embodiments, reach voltages above a battery voltage). If that is the case, the PWM controller may stop or prevent further pulse width modulation at the HOR positive driver 209. In addition, the PWM controller also switches the voltage driving the HOR positive driver 209 to a voltage higher than the previous power supply input, such as to a voltage supply rail. Such a voltage supply rail may provide one of a plurality of supply voltages, for example any voltage between 0V and 2.0V, or a battery voltage. The PWM controller may then further increase the voltage at the HOR positive driver 209 one or more times, for example by connecting to a high voltage supply or increasing the voltage on the supply rail. The voltage at the HOR positive driver 209 may be increased at least by the amount of voltage drop determined across the sensing resistor 215. The HOR positive driver 209 may then be held at that higher voltage (higher than the power supply input voltage) until the positive driver 209 is to be driven to ground. Pulse width modulation of the positive driver 209 may then be resumed.

By controlling the PWM generator and the output driver in this way, the positive output pin 219 is prevented from reaching unsupported voltages, and the resultant noise is advantageously avoided. Such control is only possible given the digital control of the PWM controller of the PWM control block 201. Meanwhile, pulse width modulation may continue with normal operation of the ZOR negative driver 213.

When operating in an intermediate mode between HOR mode and ZOR mode, the PWM controller may be configured to provide a third pulse signal to drive a voltage at the third driver (in this example, the ZOR positive driver 211). In this mode, the PWM controller may be configured to determine the voltage drop across the sensing resistor 215 by determining the voltage at the ZOR positive driver 211 relative to the first driver (in this example, the HOR positive driver 209). In some embodiments (not necessarily limited to an embodiment operating in intermediate mode), the ZOR positive driver 211 may be coupled to a sensing network which may comprise a pair of sensing resistors for sensing the voltage input at the ZOR positive driver 211. The voltage at the ZOR positive driver 211 may be determined at least in part using this sensing network. Similarly to above, the voltage at the HOR positive driver 209 may then be increased accordingly to prevent the voltage at the positive output pin 219 from reaching voltages below ground and giving rise to noise.

In some embodiments, the output driver may comprise a fourth driver (not shown) having an input and an output. The fourth driver may be a HOR negative driver, and a second sensing resistor may couple the output of the HOR negative driver with the negative output pin 221 in series. Such an embodiment may form a symmetric arrangement in which PWM control as described above may be applied to both positive and negative sides of the output driver. That is, the PWM controller of the PWM control block 201 may be configured to sense a voltage drop across the second sensing resistor between the fourth driver and the negative output pin 221. The PWM controller may sense a voltage at the ZOR negative driver 213 relative to the HOR negative driver to determine said voltage drop across the second sensing resistor. The PWM control may be balanced such that the PWM output drive is sequenced, and the voltage increased, on the side of the output driver experiencing a large voltage drop across the relevant sensing resistor. In other words, the PWM control may be applied to the side of the output driver not being driven to ground, with pulse width modulation continuing with normal operation on the side not having its PWM pulse sequenced and voltage increased to prevent unsupported voltages at the corresponding output pin. Control may then be switched to either side of the output driver where necessary.

In some embodiments, the output drivers are H-Bridge amplifiers or utilize an H-Bridge circuit. An H-Bridge, sometimes referred to as a "full bridge," is a drive structure used in some class D amplifiers. Typically, there are four switching elements within the H-Bridge. These four elements, or switches, are turned on in pairs, either high left and lower right, or lower left and high right, but not both switches on the same "side" of the H-Bridge. If both switches on one side of the H-Bridge are turned on, a short circuit, or at least a relatively low resistance path, is created between the power supply and ground. The short circuit is often referred to as shoot through current. If the high left and lower right are turned on, current flows in one direction, and if the low left and high right are turned on, current flows in the opposite direction.

The PWM controller may be configured to select an appropriate supply level switch based on the output level corresponding to the received audio signal input during the output switching for the Class-D amplifier operation. One or more of the supply switches may be shared between multiple drivers, for example between the ZOR positive driver 211 and the HOR positive driver 209 via a common node, with an analog multiplexer being controlled accordingly.

Referring to the Class-D amplifier 100 of the present disclosure, the supply voltage at the HOR positive driver 209 may be switched. For example, as described above, to avoid noise caused by the positive output pin reaching unsupported voltages, the HOR positive driver 209 may be switched to an increased voltage (and potentially further increased) and held at the higher voltage for a period of time. A period of non-overlap occurs when switching between these supply voltages (for example, switching from using a first voltage supply to a higher voltage supply) to avoid shoot through current. There is a non-overlap period during this transition in which it is possible that the positive output pin 219 may reach voltages below ground due to inductive load current.

Figure 3:
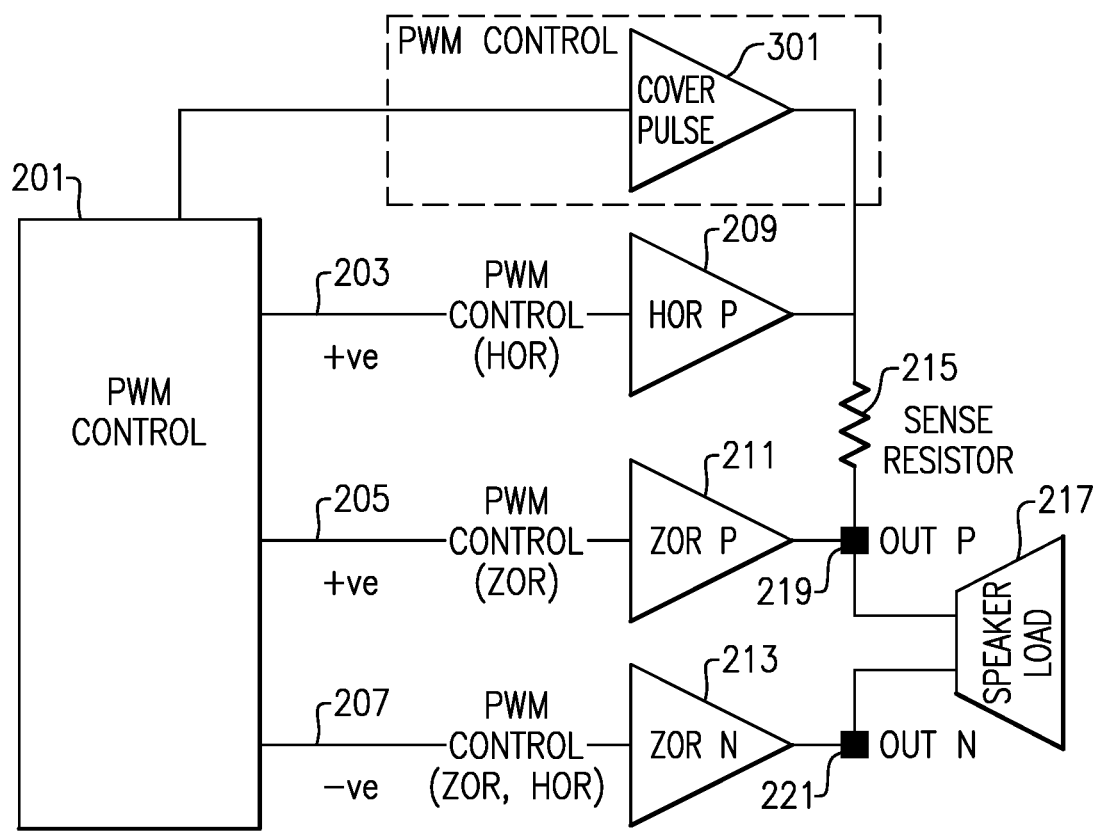
FIG. 3 is a block diagram of a portion of a Class-D amplifier including a PWM controller, output driver, and cover pulse driver according to aspects of the present disclosure.

Embodiments of the present disclosure may implement an additional driver in the form of a cover pulse driver 301 as illustrated in FIG. 3.

Each of the drivers may comprise various electrical components such as transistors, capacitors, and diodes, for example. Each of the drivers including the cover pulse driver 301, HOR positive driver 209, and ZOR positive driver 211, and ZOR negative driver 213, may comprise switches. The switches may be formed with transistors such as field effect transistors. The switches may include a plurality of supply switches, configured to couple the drivers to different voltage supply levels. The switches may also include ground switches (coupling the driver to ground), and switches used as an analog multiplexer or MUX.

The cover pulse driver 301 has an input coupled to the PWM controller of the controller block 201, allowing the PWM controller to control the cover pulse driver 301. The cover pulse driver 301 also has an output coupled to the positive output pin 219 via the sensing resistor 215 together with the output of the HOR positive driver 209.

As explained, when switching the HOR positive driver 209 between power supplies (such as between non-ground supply rails), there is a period of non-overlap to avoid shoot through current. This period may be referred to as the switching interval, which may be the time at which neither the original nor the increased power supply are driving voltage through the HOR positive driver 209. To prevent the positive output pin 219 reaching voltages below ground during this period of non-overlap and to prevent driving current to a protection diode (for example at the ZOR positive driver 211), the PWM controller may be configured to control the cover pulse driver 301 to drive a current across the sensing resistor 215 to the positive output pin 219 during the switching interval. In this way, the positive output pin 219 is prevented from reaching voltages below ground during the switching interval. Subsequently switching the HOR positive driver 209 to a ground supply rail may be avoided where this would cause audio distortion.

In more detail, the cover pulse driver 301 may comprise one or more transistors. One or more of the transistors may provide switching capability, and one or more transistors may act essentially as resistors. The PWM controller may be configured to switch or turn on a transistor at the cover pulse driver 301 to couple the positive output pin 219 with a voltage supply rail via the sensing resistor 215. The voltage supply rail provides a power supply during the switching interval to prevent the period of non-overlap causing undesirable effects at the positive output pin 219.

The PWM controller may be configured to switch on the transistor at the cover pulse driver 301 shortly before the switching interval begins, such as a few nanoseconds before the switching interval. The PWM controller may then also be configured to switch off the transistor, de-coupling the positive output pin 219 from the voltage supply rail, after the switching interval is over and the HOR positive driver 209 has been switched to an increased voltage supply.

The cover pulse driver 301 may be controlled to provide the voltage supply to the positive output pin 219 across the sensing resistor 215 during every switching interval. That is, the voltage supply to the HOR positive driver 209 may be switched multiple times, and the cover pulse driver 301 may drive a current across the sensing resistor 215 to the positive output pin 219 during each switching interval.

The transistor turned on at the cover pulse driver 301 may be effectively a resistor. The resistor does not give rise to a lot of shoot through current because it may be optimized to have the right resistance. That is, the transistors forming the resistors at the cover pulse driver 301 may have multiple configurable values. In this way, the values may be increased or decreased depending on the level of protection at the positive output pin 219 that is required.

Implementing the cover pulse driver 301 prevents negative excursion by providing current via the path through the sensing resistor 215 to the positive output pin 219. Since the resistor acts to pull the voltage up at the positive output pin 219, the voltage at the positive output pin 219 can only increase and not decrease. Therefore, no current can be driven against the protection diodes and the undesirable clipping is avoided. Thus, it is possible to prevent the positive output pin 219 from reaching voltages below ground via the inductive load current.

The value of the sensing resistor 215 may advantageously be tuned. For example, the value of the sensing resistor 215 may be established using a 3-bit control bus, or any other n-bit control bus. It may be known how much voltage drop across the sensing resistor is allowable (i.e. how much voltage must be maintained). It is also known what the audio input signal current is, and thus V=IR allows calculation of resistance based on drive. In other words, if a certain audio drive is required, an optimal resistance value may be selected, while ensuring the resistance value is small enough to pull the positive output pin 219 in the correct polarity direction.

Figure 4:
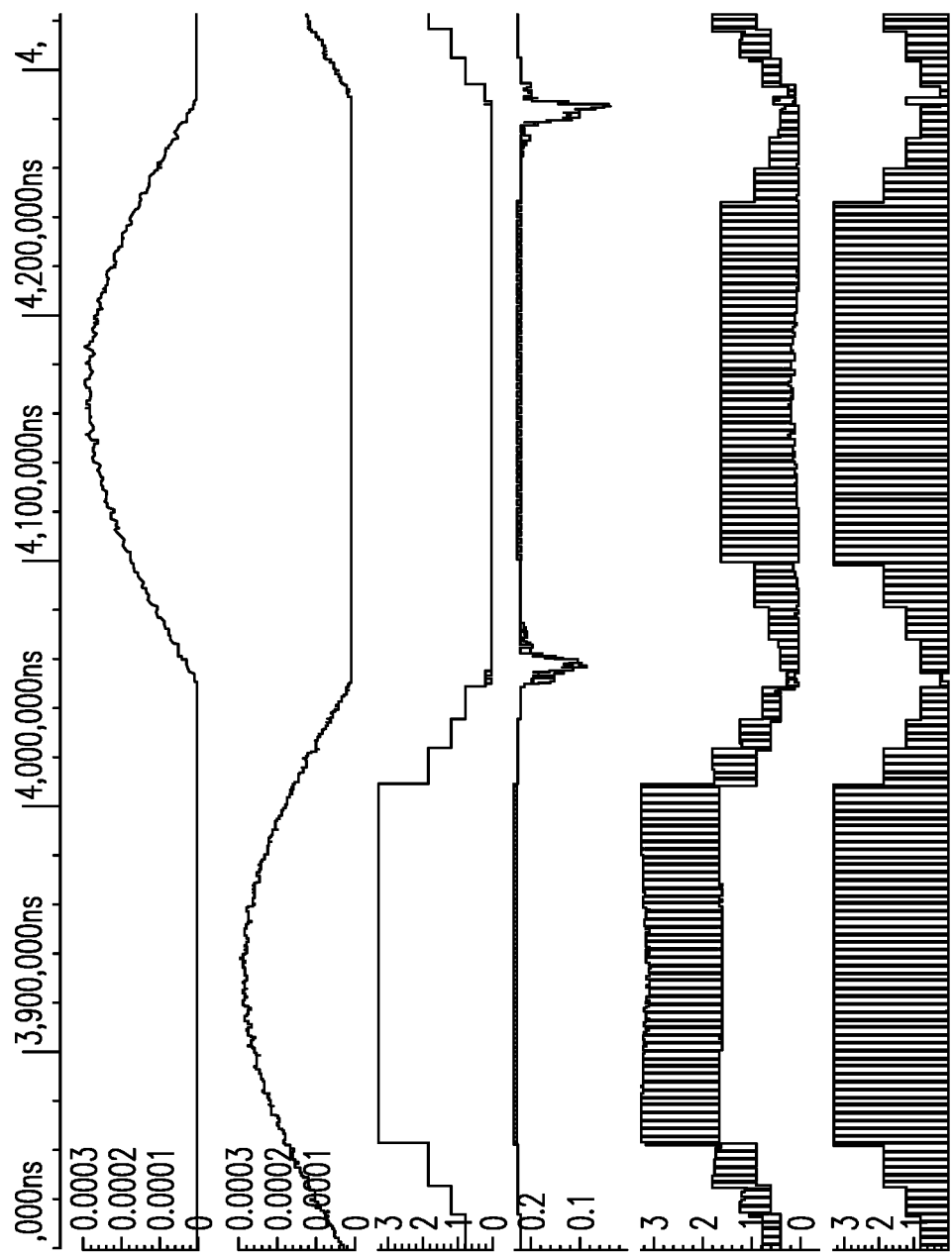
FIG. 4 is a graph illustrating operation of various aspects of the Class-D amplifier according to aspects of the present disclosure.

FIG. 4 is a graph illustrating operation of various aspects of the Class-D amplifier, for example class-D amplifier 100, according to aspects of the present disclosure. The graph illustrates operation of various aspects of the Class-D amplifier through a full cycle over which the DAC, for example DAC 110, outputs a current having positive polarity 703, and then a negative polarity 701. In other words, DAC outputs 703 and 701 illustrate that the desired output from the output driver should initially be a positive current 703 and then a negative current 701.

HOR positive driver voltage 705 can be seen being controlled in accordance with embodiments of the disclosure. When the DAC outputs positive current 703, the HOR positive driver drives a positive voltage. For the reasons explained in detail above, to prevent the first (positive) output of the output driver reaching unsupported voltages below ground when the HOR positive driver is switched to drive to ground, the voltage is increased at the HOR positive driver 705. A stepwise increase in voltage is illustrated, in which the PWM controller has switched the power supply to the HOR positive driver to increasingly high voltages, and held the voltage supply at the higher voltage for a period of time, temporarily stopping pulse width modulation at the HOR positive driver. Then, when the DAC outputs negative current 701, the HOR positive driver 705 is switched to drive to ground. It is seen that at the positive output pin 709 or middle pin coupled to the output of the third (ZOR positive) driver, even when the HOR positive driver 705 drives to ground when the DAC outputs negative current 701, the positive output pin 709 advantageously does not reach unsupported voltages below ground, thus avoiding audio distortion. For comparison, voltage at the second (ZOR negative) driver 711 is shown, at which pulse width modulation is provided by the PWM controller. As previously stated, it will be appreciated that the HOR driver driving across the sensing resistor could similarly be applied to the negative side of the amplifier, or across both sides of the amplifier in a symmetrical arrangement. Common mode 707 is shown, demonstrating that the input requirement is in the desired range.

Figure 5:
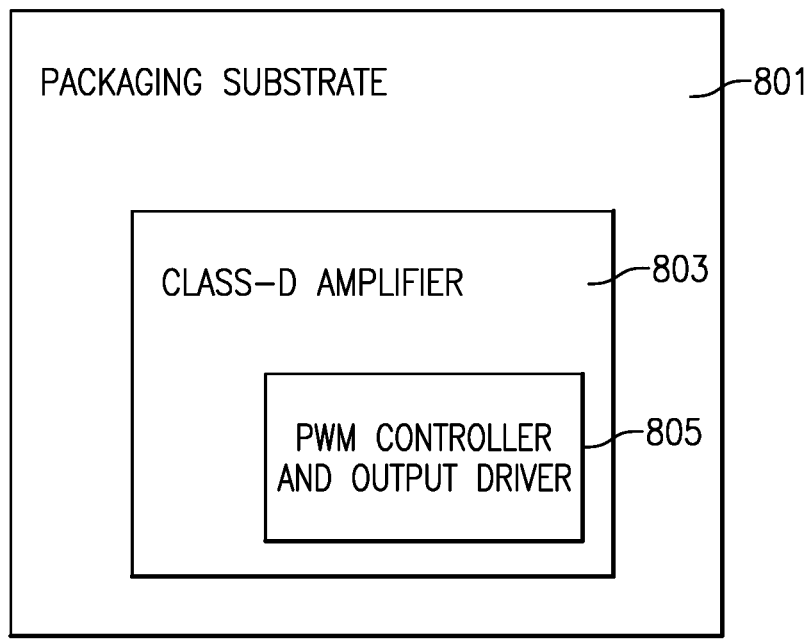
FIG. 5 is a schematic diagram of a packaging substrate including the Class-D amplifier according to aspects of the present disclosure.

In accordance with a number of implementations, a Class-D amplifier having one or more features described herein can be implemented in a chip scale package. In some embodiments, a module comprises a packaging substrate configured to receive a plurality of components. Such a module is illustrated, for example, in FIG. 5. A chip scale package is mounted on the packaging substrate 801, and the chip scale package has a silicon die that may include the Class-D amplifier 803 having one or more features described herein and having one of more associated advantages described herein. In particular, the Class-D amplifier 803 mounted on the packaging substrate 801 as part of a chip scale package may include the PWM controller and output driver 805 providing particularly advantageous features as described herein. The silicon die may comprise a redistribution layer (RDL). The silicon die may also comprise mounting features such as solder balls for mounting the silicon die.

Figure 6:
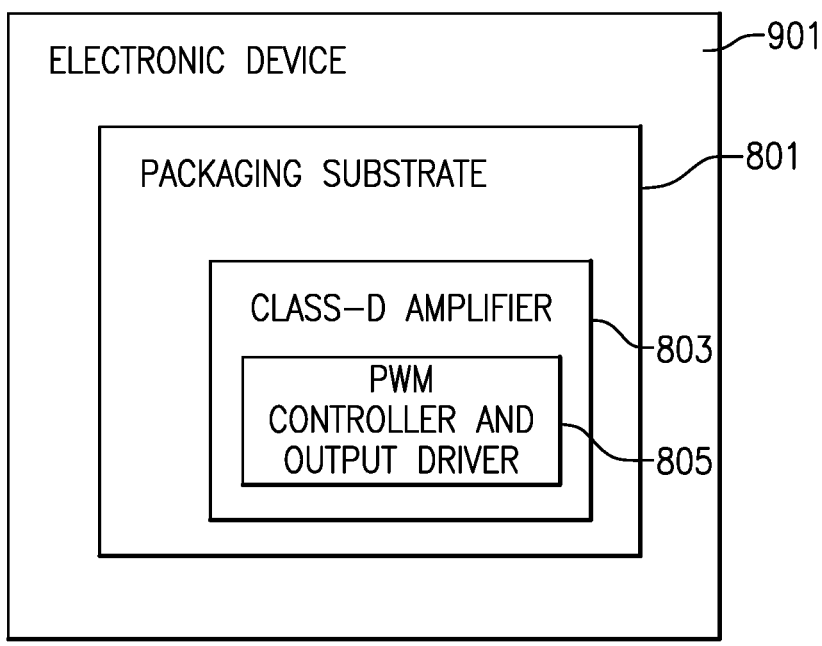
FIG. 6 is a schematic diagram of an electronic device including the packaging substrate of FIG. 5.

In accordance with some implementations, the Class-D amplifier having one or more features described herein and having one or more associated advantages described herein may be implemented in an electronic device. For example, the chip scale package illustrated in FIG. 5 may be implemented in an electronic device 901 illustrated in FIG. 6, which may comprise the packaging substrate 801, and the Class-D amplifier 803 which may have, among other features, the PWM controller and output driver 805 in accordance with embodiments described herein.

For example, aspects of this disclosure can be implemented in various electronic devices. Examples of the electronic devices can include, but are not limited to, consumer electronic products such as low power consumer electronic devices, parts of the consumer electronic products such as semiconductor die and/or packaged modules. Examples of the consumer electronic products can include any electronic device which may include a loudspeaker, and in particular a low power electronic device. This may include, for example, headphones such as wireless headphones.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An amplifier comprising:
   an output driver including a first driver, a second driver, and a third driver, each having an input and an output, and the output driver having a first output coupled to the outputs of the first driver and the third driver, and a second output coupled to the output of the second driver;
   a sensing resistor coupled in series between the output of the first driver and the first output; and
   a pulse width modulation (PWM) controller coupled to the inputs of the first, second, and third drivers and being configured to
      receive an audio input signal,
      control a PWM generator to generate a first pulse signal based on the audio input signal and a power supply input to drive a current at the first driver and a second pulse signal to drive a current at the second driver,
      determine a voltage drop across the sensing resistor, and
      sequence control of the first pulse signal to the first driver and switch a voltage at the first driver from the power supply input to an increased voltage supply based on the voltage drop responsive to determining that the voltage drop is greater than a predetermined threshold.

2. The amplifier of claim 1 wherein the PWM controller is configured to determine the voltage drop across the sensing resistor by determining the voltage at the third driver relative to the first driver.

3. The amplifier of claim 1 wherein the voltage at the first driver is configured to be increased by at least as much as a magnitude of the voltage drop across the sensing resistor.

4. The amplifier of claim 1 wherein the PWM controller is configured to sequence control of the first pulse signal by temporarily stopping the first pulse signal while the voltage at the first driver is switched to the increased voltage supply, and continuing to provide the second pulse signal.

5. The amplifier of claim 1 wherein the PWM controller is further configured to switch the voltage at the first driver from the increased voltage supply to a third voltage supply providing a higher voltage than the increased voltage supply.

6. The amplifier of claim 1 wherein the first output and second output of the output driver are coupled to a loudspeaker, the output driver being configured to provide an output current signal corresponding to the audio input signal to drive the loudspeaker.

7. The amplifier of claim 6 wherein the sensing resistor has a resistance approximately equal to a load impedance of the loudspeaker.

8. The amplifier of claim 1 wherein the amplifier is configured to operate in a high output resistance (HOR) mode in which the third driver does not drive a current.

9. The amplifier of claim 1 wherein:
   the amplifier is configured to operate in an intermediate mode between a high output resistance (HOR) mode and a zero output resistance (ZOR) mode, the PWM controller being configured to provide a third pulse signal to drive a voltage at the third driver in the intermediate mode based on the audio input signal and a power supply input; and
   the PWM controller is configured to determine the voltage drop across the sensing resistor by determining the voltage at the third driver relative to the first driver, the voltage at the third driver at least in part being determined using a sensing network coupled to the output of the third driver.

10. The amplifier of claim 1 wherein the output driver further comprises:
    a fourth driver having an output; and
    a second sensing resistor coupled in series between the output of the fourth driver and the second output of the output driver, wherein the PWM controller is further configured to
       provide a fourth pulse signal to drive a current at the fourth driver based on the audio input signal and the power supply input,
       determine a voltage drop across the second sensing resistor, and
       sequence control of the fourth pulse signal to the fourth driver and switch a voltage at the fourth driver from the power supply input to an increased voltage supply based on the voltage drop across the second sensing resistor responsive to determining that the voltage drop across the second sensing resistor is greater than a predetermined threshold.

11. The amplifier of claim 1 wherein the PWM controller is configured to switch the voltage at the first driver to the increased voltage supply over a switching interval, and the PWM controller is further configured to control a cover pulse driver having an output coupled to the first output of the output driver via the sensing resistor to drive a current across the sensing resistor to the first output during the switching interval.

12. The amplifier of claim 11 wherein the PWM controller is configured to, before the switching interval, turn on a transistor at the cover pulse driver to couple the first output with a voltage supply rail via the sensing resistor for driving the current across the sensing resistor during the switching interval, and after the switching interval, turn off the transistor.

13. The amplifier of claim 1 wherein the output driver is a H-Bridge amplifier.

14. The amplifier of claim 1 wherein the current at the first driver has positive polarity and the current at the second driver has a negative polarity.

15. The amplifier of claim 1 wherein the current at the first driver has negative polarity and the current at the second driver has a positive polarity.

16. The amplifier of claim 1 wherein the third driver comprises one or more protection diodes.

17. An electronic device comprising:
an output driver having a first driver, a second driver, and a third driver, each driver having an input and an output, and the output driver having a first output coupled to the outputs of the first driver and the third driver, and a second output coupled to the output of the second driver;
a sensing resistor coupled in series between the output of the first driver and the first output; and
a pulse width modulation (PWM) controller coupled to the inputs of the first, second, and third drivers and being configured to
receive an audio input signal,
control a PWM generator to generate a first pulse signal to drive a current at the first driver and a second pulse signal to drive a current at the second driver based on the audio input signal and a power supply input,
determine a voltage drop across the sensing resistor and
sequence control of the first pulse signal to the first driver and switch a voltage at the first driver from the power supply input to an increased voltage supply based on the voltage drop responsive to determining that the voltage drop is greater than a predetermined threshold, the first output and second output of the output driver being coupled to a loudspeaker to provide an output current signal corresponding to the audio input signal to drive the loudspeaker.

18. A method for reducing audio distortion in a Class-D amplifier having a pulse width modulation (PWM) controller, the method comprising:
receiving an audio input signal;
controlling a PWM generator to generate a first pulse signal to drive a current at a first driver of an output driver and a second pulse signal to drive a current at a second driver of the output driver based on the audio input signal and a power supply input, the output driver also having a third driver, a first output coupled to outputs of the first driver and the third driver, and a second output coupled to an output of the second driver;
determining a voltage drop across a sensing resistor coupled between the output of the first driver and the first output of the output driver; and
sequencing control of the first pulse signal to the first driver and switching a voltage at the first driver from the power supply input to an increased voltage supply based on the voltage drop responsive to determining that the voltage drop is greater than a predetermined threshold.

19. The method of to claim 18 wherein the sequencing control of the first pulse signal to the first driver comprises temporarily stopping the first pulse signal while the voltage at the first driver is switched to the increased voltage supply, and continuing to provide the second pulse signal.

20. The method of to claim 18 further comprising:
operating in an intermediate mode between a high output resistance (HOR) mode and a zero output resistance (ZOR) mode;
controlling PWM controller to generate a third pulse signal to drive a current at the third driver in the intermediate mode based on the audio input signal and a power supply input; and
determining the voltage drop across the sensing resistor by determining the voltage at the third driver relative to the first driver, the voltage at the third driver at least in part being determined using a sensing network coupled to the output of the third driver.

* * * * *